United States Patent
Yang et al.

(12)

(10) Patent No.: US 11,051,413 B2
(45) Date of Patent: Jun. 29, 2021

(54) TERMINAL AND RETRACTABLE MECHANICAL MEMBER

(71) Applicant: BEIJING XIAOMI MOBILE SOFTWARE CO., LTD., Beijing (CN)

(72) Inventors: Jieming Yang, Beijing (CN); Gaocai Han, Beijing (CN); Xuehu Zhang, Beijing (CN); Hongzhi Jin, Beijing (CN)

(73) Assignee: BEIJING XIAOMI MOBILE SOFTWARE CO., LTD., Beijing (CN)

(*) Notice: Subject to any disclaimer, the term of this patent is extended or adjusted under 35 U.S.C. 154(b) by 0 days.

(21) Appl. No.: 16/834,332

(22) Filed: Mar. 30, 2020

(65) Prior Publication Data

US 2020/0337159 A1 Oct. 22, 2020

(30) Foreign Application Priority Data

Apr. 22, 2019 (CN) .......................... 201910325224.2

(51) Int. Cl.
*H05K 5/00* (2006.01)
*H05K 5/02* (2006.01)
*F16H 19/04* (2006.01)

(52) U.S. Cl.
CPC ........... *H05K 5/0017* (2013.01); *F16H 19/04* (2013.01); *H05K 5/0217* (2013.01)

(58) Field of Classification Search
CPC .... H05K 5/0017; H05K 5/0217; F16H 19/04; G06F 1/1626; G06F 1/1652; H04M 1/026; H04M 1/0268; H04M 1/0266; H04M 1/0235; H04M 1/0214; H04M 1/0264
See application file for complete search history.

(56) References Cited

U.S. PATENT DOCUMENTS

| 8,385,055 B2* | 2/2013 | Kao ...................... G06F 1/1616 |
| | | 361/679.06 |
| 8,873,225 B2* | 10/2014 | Huitema ............... G06F 1/1656 |
| | | 361/679.01 |
| 10,111,346 B2* | 10/2018 | Seo ........................ G06F 1/1624 |
| 10,152,086 B2* | 12/2018 | Choi ..................... G06F 1/1652 |
| 10,448,521 B2* | 10/2019 | Seo .......................... G09F 9/301 |

(Continued)

FOREIGN PATENT DOCUMENTS

CN 109618033 A 4/2019

OTHER PUBLICATIONS

Extended European search report of counterpart EP application No. 20167056.9 dated Jul. 27, 2020.

*Primary Examiner* — Abhishek M Rathod
(74) *Attorney, Agent, or Firm* — Syncoda LLC; Feng Ma

(57) ABSTRACT

A terminal includes: a body including a body front and a body rear; a flexible display screen extending from the body front to the body rear; and a retractable mechanical member arranged at an edge between the body front and the body rear. The retractable mechanical member is configured to drive a display region of the flexible display screen located on the body rear to move from the body rear to the body front along the edge when the retractable mechanical member is in an outwardly extended state, and drive a display region of the flexible display screen located on the body front to move from the body front to the body rear along the edge when the retractable mechanical member is in an inwardly retracted state.

17 Claims, 10 Drawing Sheets

(56) References Cited

U.S. PATENT DOCUMENTS

| | | | |
|---|---|---|---|
| 10,488,959 B2 * | 11/2019 | Aurongzeb | G06F 1/1679 |
| D871,397 S * | 12/2019 | Seo | D14/341 |
| 10,499,515 B2 * | 12/2019 | Lee | H05K 1/0283 |
| 10,551,880 B1 * | 2/2020 | Ai | G06F 1/1641 |
| 10,553,135 B2 * | 2/2020 | Lee | G09F 9/301 |
| 10,747,269 B1 * | 8/2020 | Choi | G06F 1/1656 |
| 10,868,897 B2 * | 12/2020 | Cha | H04M 1/0268 |
| 10,881,009 B2 * | 12/2020 | Jiang | H05K 5/0017 |
| 2006/0068859 A1 * | 3/2006 | Lee | H04M 1/0237 |
| | | | 455/575.4 |
| 2007/0146243 A1 * | 6/2007 | Ou Yang | G06F 1/1601 |
| | | | 345/76 |
| 2008/0144265 A1 * | 6/2008 | Aoki | H04M 1/0268 |
| | | | 361/679.04 |
| 2012/0162876 A1 * | 6/2012 | Kim | H04M 1/0237 |
| | | | 361/679.01 |
| 2012/0212433 A1 * | 8/2012 | Lee | G06F 3/041 |
| | | | 345/173 |
| 2013/0058063 A1 | 3/2013 | O'Brien et al. | |
| 2014/0022714 A1 * | 1/2014 | Huang | G06F 1/1679 |
| | | | 361/679.01 |
| 2014/0380186 A1 * | 12/2014 | Kim | G06F 1/1652 |
| | | | 715/746 |
| 2016/0202781 A1 * | 7/2016 | Kim | G06F 1/1643 |
| | | | 345/173 |
| 2016/0374228 A1 * | 12/2016 | Park | H05K 7/16 |
| 2017/0023978 A1 * | 1/2017 | Cho | H04M 1/0268 |
| 2017/0186400 A1 | 6/2017 | Song et al. | |
| 2017/0212556 A1 | 7/2017 | Jovanovic | |
| 2017/0280570 A1 * | 9/2017 | Li | G06F 1/1652 |
| 2017/0364119 A1 * | 12/2017 | Lee | G06F 1/1652 |
| 2018/0049328 A1 * | 2/2018 | Choi | G06F 1/1601 |
| 2018/0081473 A1 * | 3/2018 | Seo | H05K 5/0017 |
| 2018/0103550 A1 | 4/2018 | Seo et al. | |
| 2018/0103552 A1 * | 4/2018 | Seo | G06F 1/1624 |
| 2019/0163242 A1 * | 5/2019 | Zeng | G06F 1/188 |
| 2019/0253543 A1 * | 8/2019 | Fan | H05K 5/0086 |

* cited by examiner

TERMINAL AND RETRACTABLE MECHANICAL MEMBER

CROSS-REFERENCE TO RELATED APPLICATION

The present application claims priority to Chinese Patent Application No. 201910325224.2 filed on Apr. 22, 2019, the disclosure of which is hereby incorporated by reference in its entirety.

BACKGROUND

A flexible display screen is a deformable and bendable display apparatus made of a flexible material. Flexible display screens may be used in foldable mobile phones.

SUMMARY

The present disclosure relates generally to the field of electronic device, and more specifically to a terminal and a retractable mechanical member.

According to one aspect of the present disclosure, a terminal is provided. The terminal includes: a body including a body front and a body rear; a flexible display screen extending from the body front to the body rear; and a retractable mechanical member provided at an edge between the body front and the body rear and located on an inside of the flexible display screen; wherein, the retractable mechanical member is configured to drive a display region of the flexible display screen located on the body rear to move from the body rear to the body front along the edge, when the retractable mechanical member is in an outwardly extended state; the retractable mechanical member is configured to drive a display region of the flexible display screen located on the body front to move from the body front to the body rear along the edge, when the retractable mechanical member is in an inwardly retracted state.

According to another aspect of the present disclosure, a retractable mechanical member is provided. The retractable mechanical member is disposed at an edge of a terminal and located on an inside of a flexible display screen of the terminal, and the flexible display screen extends from a body front of the terminal to a body rear of the terminal; the retractable mechanical member is configured to drive a display region of the flexible display screen located on the body rear to move from the body rear to the body front along the edge, when the retractable mechanical member is in an outwardly extended state; the retractable mechanical member is configured to drive a display region of the flexible display screen located on the body front to move from the body front to the body rear along the edge, when the retractable mechanical member is in an inwardly retracted state.

It is to be understood that both the foregoing general description and the following detailed description are exemplary only and are not intended to limit the present disclosure.

BRIEF DESCRIPTION OF THE DRAWINGS

In order to describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may also derive other drawings from these accompanying drawings without creative efforts.

FIG. 14 is a bottom view of a terminal a second form provided by some embodiments of the present disclosure in;

DETAILED DESCRIPTION

Figure 1:
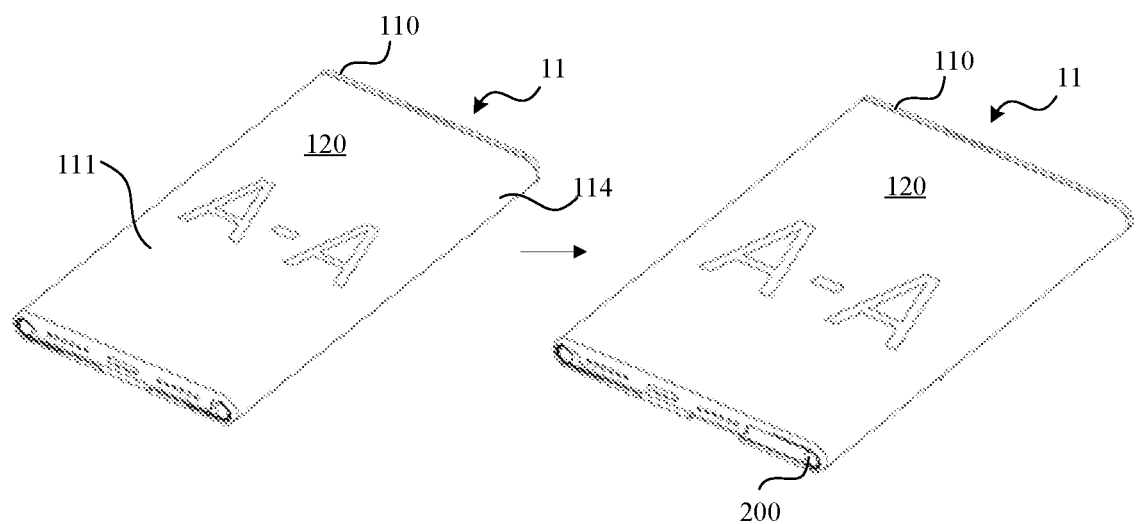
FIG. 1 is a form change diagram of a front side of a terminal provided by some embodiments of the present disclosure.

Embodiments of the present disclosure will be described in more detail below with reference to the accompanying drawings. Although the drawings show some embodiments of the present disclosure, it should be understood that the present disclosure may be implemented in various forms and should not be construed as limited to the embodiments set forth herein. Rather, these embodiments are provided for more thorough and complete understanding of the present disclosure. It should be understood that the drawings and embodiments of the present disclosure are only for exemplary purposes, and are not intended to limit the protection scope of the present disclosure.

The term "including" and variations thereof used herein are open-ended, i.e., "including but not limited to." The term "based on" means "based at least in part on." The term "one embodiment" means "at least one embodiment," the term "another embodiment" means "at least one other embodiment." Relevant definitions of other terms will be given in the description below.

A flexible display screen is a display screen that may be bent and has flexibility. For example, the flexible display screen may be implemented as an Organic Light-Emitting Diode (OLED) display screen. As an example, the flexible display screen may change the screen form by bending, folding, or the like.

A foldable mobile phone may have two operation forms, i.e., a folded form and an unfolded form, by means of the deformable characteristic of the flexible display screen. In the folded form, the smaller display area of the foldable mobile phone is presented to the user, while in the unfolded form, the larger display area of the foldable mobile phone is presented to the user.

The mechanism for folding and unfolding the foldable mobile phone can be relatively complex, and the application modes of the flexible display screen are rather few, which cannot meet the actual application requirements.

In some embodiments of the present disclosure, a terminal having a retractable body edge is provided by means of a bendable characteristic of a flexible display screen. For example, a mobile phone that may be extended or retracted along left and right edges is provided. A retractable mechanical member is provided at the edge of the terminal. The retractable mechanical member may vary among three states, i.e., a stationary state, an outwardly extended state, and an inwardly retracted state, thereby driving the display area (or display scale) of the display region of the flexible display screen located on the body front to change, so as to meet the user's actual needs for the display screens with different display areas (or display scales).

In some embodiments of the present disclosure, the terminal may switch between a first form and a second form through the extension and retraction of the retractable mechanical member. The first form refers to a form in which the display region on the body front of the terminal has a minimum area. The second form refers to a form in which the display region on the body front of the terminal has a maximum area. When needed, the terminal may also remain stationary in any intermediate form between the first form and the second form. The intermediate form refers a form in which the area of the display region on the body front of the terminal is between the minimum area and the maximum area.

Figure 2:
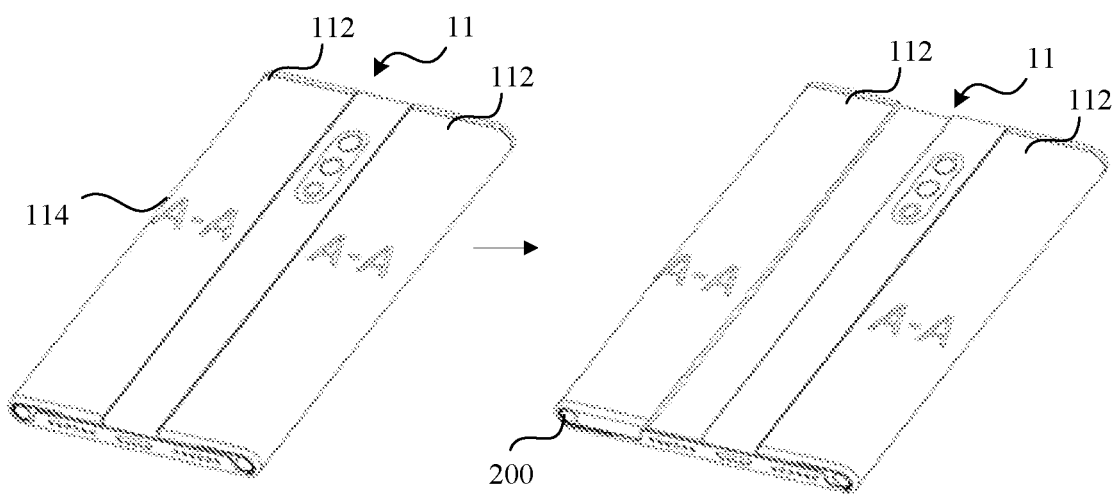
FIG. 2 is a form change diagram of a rear side of a terminal provided by some embodiments of the present disclosure.

FIGS. 1 and 2 respectively show form changes of a front and a rear of a terminal 11 provided according to some embodiments of the present disclosure. The terminal 11 includes a body 110, a flexible display screen 120, and a retractable mechanical member 200.

As shown in FIG. 1, the body 110 includes a body front 111 and a body rear 112. The flexible display screen 120 extends from the body front 111 to the body rear 112. As can be seen from FIG. 1, because the flexible display screen 120 may extend from the body front 111 to the body rear 112, the flexible display screen 120 may, for example, bend to cover an edge 114 between the body front 111 and the body rear 112 (as an example, FIG. 1 shows a right edge).

Further with reference to FIG. 1, the retractable mechanical member 200 is disposed at the edge 114 between the body front 111 and the body rear 112 and is located on an inside of the flexible display screen 120. As an example, the body front 111 may be substantially rectangular (or a rounded rectangle). The edge 114 may include at least one of an upper edge, a lower edge, a left edge, and a right edge. In FIGS. 1 and 2, as an example, the edge 114 is the right edge of the body front 111.

In FIG. 1, the retractable mechanical member 200 may be varied or switched among three states: a stationary state, an outwardly extended state, and an inwardly retracted state. As an example, the stationary state may be a state in which the position of the retractable mechanical member 200 remains unchanged. The outwardly extended state may be a state in which the retractable mechanical member 200 is extended in a direction from an inside of the body toward an outside of the body. The inwardly retracted state may be a state in which the retractable mechanical member 200 is retracted in a direction from the outside of the body toward the inside of the body.

According to some embodiments of the present disclosure, the retractable mechanical member 200 may be configured to drive the display region of the flexible display screen 120 located on the body rear 112 to move from the body rear 112 to the body front 111 along the edge 114 when in the outwardly extended state. Further, the retractable mechanical member 200 may be configured to drive the display region of the flexible display screen 120 located on the body front 111 to move from the body front 111 to the body rear 112 along the edge 114 when in the inwardly retracted state.

It can be understood that when the retractable mechanical member 200 is in the outwardly extended state, the retractable mechanical member 200 may be extended in a direction from the inside of the body toward the outside of the body, thereby driving the display region of the flexible display screen 120 located on the body rear 112 to move from the body rear 112 to the body front 111 along the edge 114. Correspondingly, when the retractable mechanical member 200 is in the inwardly retracted state, the retractable mechanical member 200 may be retracted in a direction from the outside of the body toward the inside of the body, thereby driving the display region of the flexible display screen 120 located on the body front to move from the body front 111 to the body rear 112 along the edge 114.

It can be seen that, in the terminal provided by the embodiment of the present disclosure, the flexible display screen may extend from the body front to the body rear, and the retractable mechanical member is provided at the edge between the body front and the body rear. When the retractable mechanical member is in the outwardly extended state, the area of the display region of the flexible display screen located on the body front is increased, and when the retractable mechanical member is in the inwardly retracted state, the area of the display region of the flexible display screen located on the body front is decreased. Therefore, the area of the display screen located on the body front of the terminal may be increased or decreased when needed (for example, the display region on the body front provides different display areas during the extension and retraction), so as to fully utilize the deformable characteristics of the flexible display screen to meet the actual needs of users for switching among different areas of the display screen.

In an example of this embodiment, because the retractable mechanical member 200 may be in a stationary state when it is extended or retracted to any position, the display region on the body front 111 may provide different display areas (or display scales). For example, a 3:2 display scale is used on the body front 111 when browsing a web, a 16:9 display scale is used on the body front 111 when watching a teleplay, and a 21:9 display scale is used on the body front 111 when watching a movie. Therefore, the terminal provided by this embodiment may operate in various display areas or display scales.

In the terminal provided by the embodiment of the present disclosure, because the retractable mechanical member 200 is disposed at the edge 114 between the body front 111 and the body rear 112 and is located on the inside of the flexible display screen 120, when the edge 114 is designed to have a constant curvature, the following technical effect is possible: the flexible display screen may slide at the edge with a constant curvature, so that the forces applied to portions of the flexible display screen are uniform, and an phenomenon that forces are unevenly distributed does not occur. Therefore, the aging speed of the screen region may be effectively reduced, and no or less creases will occur. In contrast, in a foldable mobile phone with a hinge-type design (for example, rotating the screen to open and close by a hinge), its flexible display screen is distributed on the front, the edge rotation shaft and the rear of the foldable mobile phone in a curved form. In this case, because a screen region on the edge rotation shaft is constantly bent at a large angle (the curvature changes inside and outside of the screen are inconsistent due to the thickness), the force applied to the screen region may be significantly different from that to other regions, thereby resulting in rapid aging of the screen region and creases are apt to occur.

There may be one or more "edges" in the embodiments of the present disclosure, for example, including but not limited to any of the two following forms:

1. an edge of the body front;
For example, it is the left edge or the right edge shown in FIGS. 1 and 2. In some embodiments, the edge may be an upper edge or a lower edge.

2. the opposite first and second edges on the body front
For example, they are the left and right edges shown in FIGS. 1 and 2.

Some embodiments of a terminal provided with retractable mechanical members at both the first edge and the second edge will be described below with reference to the accompanying drawings.

FIGS. 3 to 10 illustrate six side views and perspective views of a terminal in a first form provided according to some embodiments of the present disclosure. As shown in FIGS. 3 to 10, the terminal 11 includes a body 110, a flexible display screen 120, and a retractable mechanical member (for example, including a first retractable mechanical member 201 and a second retractable mechanical member 202).

The body 110 includes a body front 111 and a body rear 112. The flexible display screen 120 extends from a first edge 113 and a second edge 114 of the body front 111 to the body rear 112, respectively. As an example of this embodiment, the first edge may be a left edge of the body front 111, and the second edge may be a right edge of the body front 111.

The first edge 113 may be provided with at least one first retractable mechanical member 201, and the second edge 114 may be provided with at least one second retractable mechanical member 202. As an example, a row of (for example, a plurality of uniformly distributed) first retractable mechanical members 201 may be disposed at the first edge 113 of the body front 111. A row of (for example, a plurality of uniformly distributed) second retractable mechanical members 202 may be disposed at the second edge 114 of the body front 111. It can be understood that the first retractable mechanical member 201 and the second retractable mechanical member 202 operate in the same principle. In some embodiments, two first retractable mechanical members 201 are provided at the first edge 113, which are respectively disposed near the third and fourth edges. Correspondingly, two second retractable mechanical members 202 are provided at the second edge 114, which are respectively disposed near the third and fourth edges. In FIGS. 3 to 10, as an example, the third edge is an upper edge of the body front 111, and the fourth edge is the lower edge of the body front 111.

Figure 3:
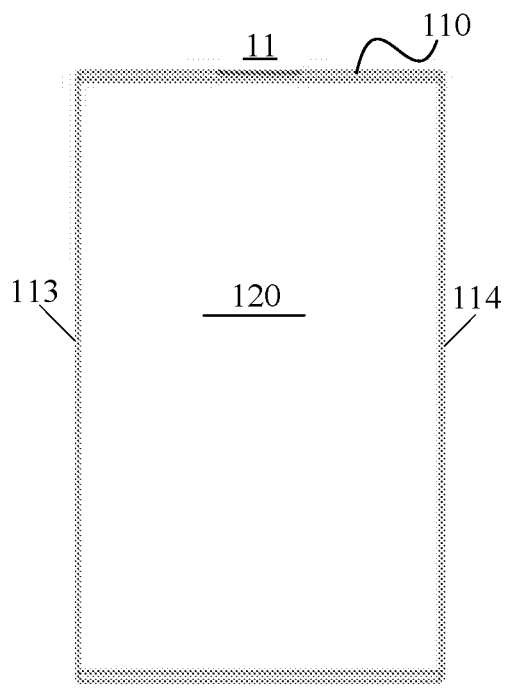
FIG. 3 is a front view of a terminal in a first form provided by some embodiments of the present disclosure.
Figure 4:
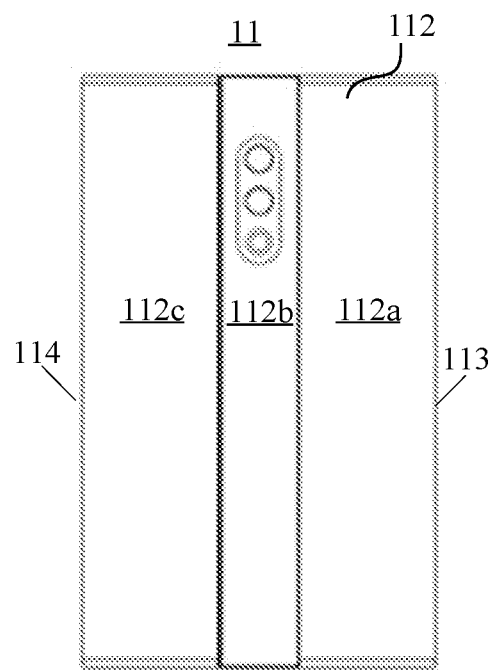
FIG. 4 is a rear view of a terminal in a first form provided by some embodiments of the present disclosure.
Figure 5:
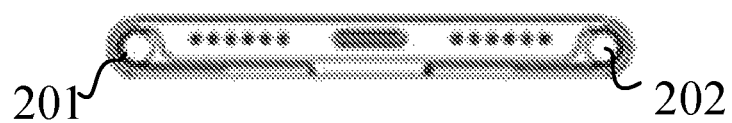
FIG. 5 is a bottom view of a terminal in a first form provided by some embodiments of the present disclosure.
Figure 6:
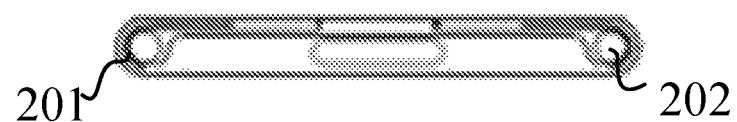
FIG. 6 is a top view of a terminal in a first form provided by some embodiments of the present disclosure.
Figure 7:
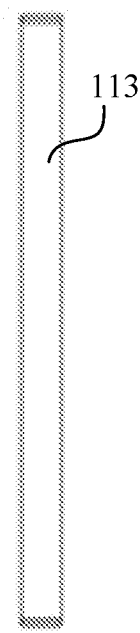
FIG. 7 is a left view of a terminal in a first form provided by some embodiments of the present disclosure.
Figure 8:
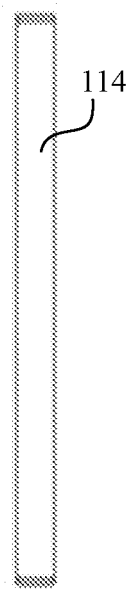
FIG. 8 is a right view of a terminal in a first form provided by some embodiments of the present disclosure.
Figure 9:
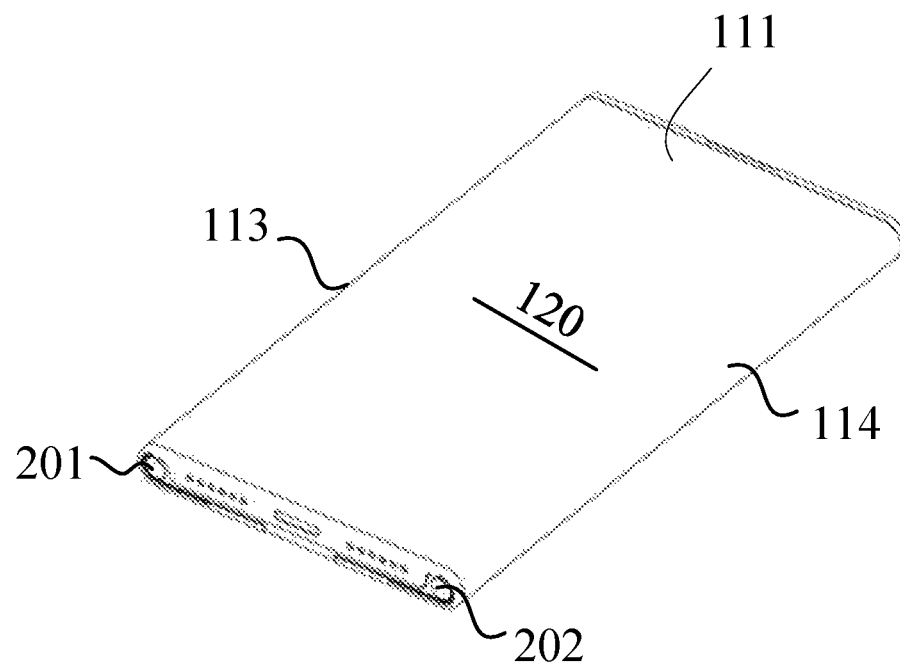
FIG. 9 is a front perspective diagram of a terminal in a first form provided by some embodiments of the present disclosure.
Figure 10:
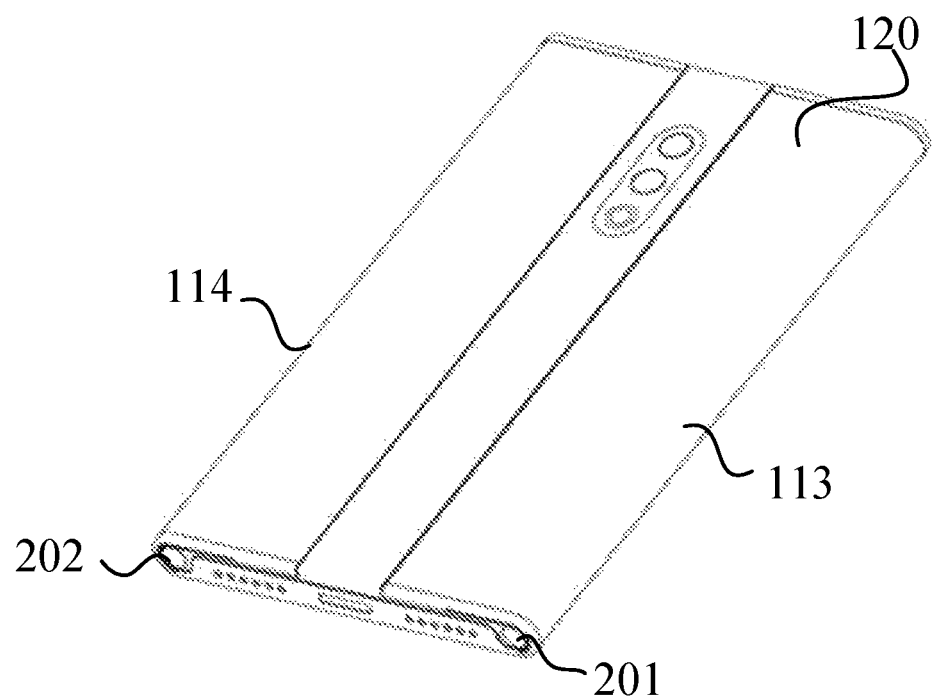
FIG. 10 is a rear perspective diagram of a terminal in a first form provided by some embodiments of the present disclosure.

Referring to FIG. 4, the body rear 112 includes a first region 112a, an intermediate region 112b, and a second region 112c. The display region on the left side of the flexible display screen 120 in FIG. 3 (which may be referred to as a "first display region" in this embodiment) extends (or curvedly covers) from the first edge 113 to the first region 112a of the body rear 112. The display region on the right side of the flexible display screen 120 in FIG. 3 (which may be referred to as a "second display region" in this embodiment) extends (or curvedly covers) from the second edge 114 to the second region 112c of the body rear 112.

As an example of this embodiment, the first region 112a and the second region 112c of the body rear 112 are symmetrically disposed with the intermediate region 112b as the center, as shown in FIG. 4. The first region 112a may be a region from the right edge of the body rear 112 (for example, the right edge may correspond to the first edge 113 on the body front 111) to a one-third line of the body rear 112 on the right, that is, the first region 112a occupies one third of the area of the entire body rear 112. The second region 112c may be a region from the left edge of the body rear 112 (for example, the left edge may correspond to the second edge 114 on the body front 111) to a one-third line of the body rear 112 on the left, that is, the second region 112c occupies one-third of the area of the entire body rear 112. The intermediate region 112b is located at the center of the body rear 112. The intermediate region of the body rear 112 may be provided with at least one of a camera, a flash, a fingerprint sensor, an optical sensor, and a distance sensor.

It can be seen that, in the terminal provided by this embodiment, by extending and covering the flexible display screen from the first edge and the second edge of the body front to the body rear respectively, and providing a first retractable mechanical member at the first edge, providing a second retractable mechanical member at the second edge, the body front may extend or retract respectively at the two edges. Therefore, the area of the flexible display screen may increase or decrease on both sides. Moreover, regardless of holding the terminal with the left hand or the right hand, the user may both operate the retractable mechanical members in a relatively convenient way.

Further, in the terminal provided by this embodiment, by dividing the body rear into a first region, a second region, and an intermediate region, the intermediate region may be provided with at least one of a camera, a flash, a fingerprint sensor, an optical sensor, and a distance sensor. In this way, it is convenient for a user to photograph, or take a high-quality photo while photographing, or implement corresponding operation (e.g., fingerprint authentication or unlocking) through a fingerprint sensor. Furthermore, when shooting (e.g., self-shooting) with a camera, the display region on the body rear may be used to display the shooting preview image.

As an example of this embodiment, the flexible display screen 120 on the body rear 112 may partly occupy the area of the body rear 112, as shown in FIG. 4. For example, the flexible display screen 120 on the body rear 112 occupies one third, or one half, or two thirds of the area of the body rear 112. As another example of this embodiment, the flexible display screen 120 on the body rear 112 may occupy the entire region of the body rear 112, i.e., the area of the flexible display screen 120 on the body rear 112 is relatively consistent with the area of the body rear 112. In this case, the camera may be provided at the upper or lower edge of the body with a retractable design.

According to some embodiments of the present disclosure, the retractable mechanical member 200 may be varied or switched between any two states of a stationary state, an outwardly extended state, and an inwardly retracted state. When the retractable mechanical member 200 is in the outwardly extended state, the display area of the flexible display screen 120 on the body front 111 may be increased, that is, the display area of the flexible display screen 120 on the body rear 112 may be decreased. Correspondingly, when the retractable mechanical member 200 is in the inwardly retracted state, the display area of the flexible display screen 120 on the body front 111 may be decreased, that is, the display area of the flexible display screen 120 on the body rear 112 may be increased. It should be noted that the entire area of the flexible display screen 120 (including the display areas of the body front 111 and the body rear 112) remains unchanged.

As an example of this embodiment, the extended and retracted states of the first retractable mechanical member 201 and the second retractable mechanical member 202 may be synchronized. As another example of this embodiment, the extended and retracted states of the first retractable mechanical member 201 and the second retractable mechanical member 202 may be independent of each other. As an example, the extended and retracted states may include an outwardly extended state and an inwardly retracted state.

Figure 11:
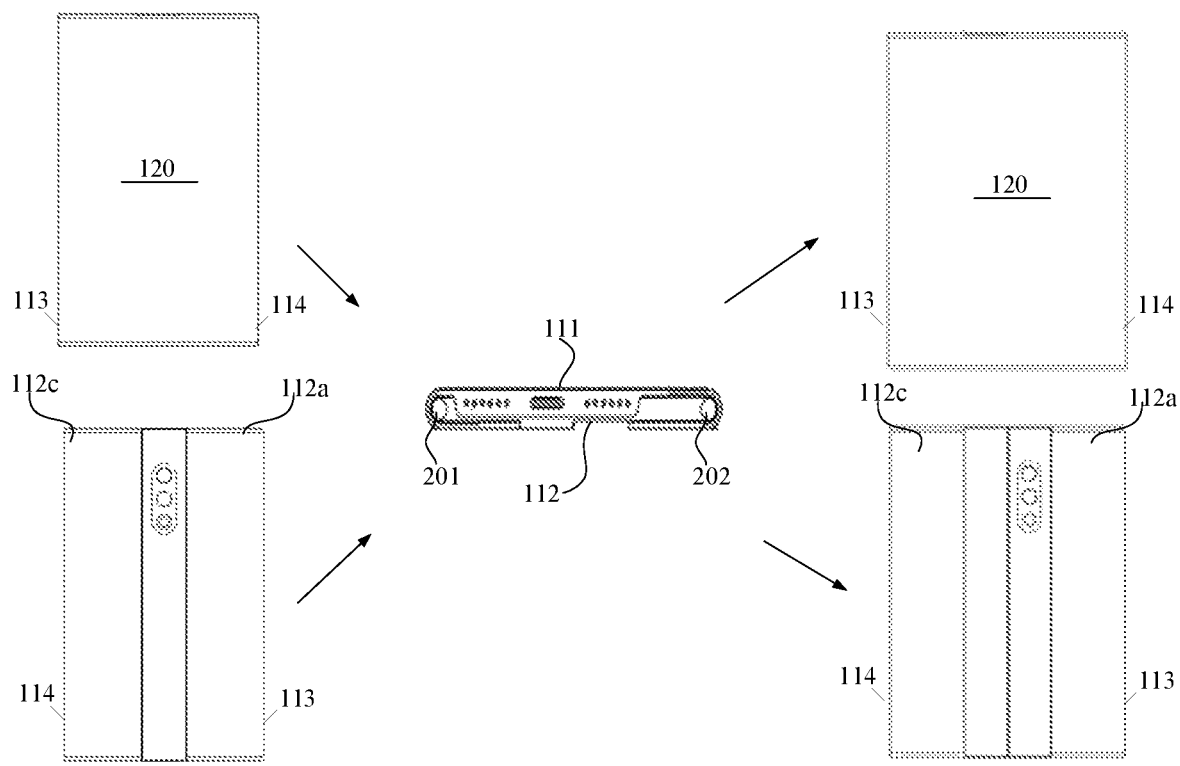
FIG. 11 is a schematic diagram of an intermediate form of a second retractable mechanical member of a terminal in an outwardly extended state provided by some embodiments of the present disclosure.

Taking the extended and retracted states of the first retractable mechanical member 201 and the second retractable mechanical member 202 are independent of each other as an example, FIG. 11 shows a schematic diagram of the intermediate form of the second retractable mechanical member 202 in the outwardly extended state provided by some embodiments of the present disclosure. As shown in FIG. 11, a first retractable mechanical member 201 is disposed at the first edge 113, and a second retractable mechanical member 202 is disposed at the second edge 114. It can be understood that the first retractable mechanical member 201 and the second retractable mechanical member 202 operate in the same principle. When the second retractable mechanical member 202 is in the outwardly extended state, the second retractable mechanical member 202 is used to drive the display region of the flexible display screen located on the body rear 112 to move from the body rear 112 (e.g., the second region 112c) to the body front 111 along the second edge 114. Correspondingly, when the second retractable mechanical member 202 is in the inwardly retracted state, the second retractable mechanical member 202 is used to drive the display region on the body front 111 to move from the body front 111 to the body rear 112 (e.g., the second region 112c) along the second edge 114.

Based on the embodiment shown in FIG. 11, it can be seen that, when the first retractable mechanical member 201 is in the outwardly extended state, the first retractable mechanical member 201 is used to drive the display region on the body rear 112 to move from the body rear 112 (e.g., the first region 112a) to the body front 111 along the first edge 113. Correspondingly, when the first retractable mechanical member 201 is in the inwardly retracted state, the first retractable mechanical member 201 is used to drive the display region on the body front 111 to move from the body front 111 to the body rear 112 (e.g., the first region 112a) along the first edge 113.

FIGS. 12 to 17 show four side views and perspective views of a terminal in a second form provided by some embodiments of the present disclosure. Two retractable mechanical members (for example, including the first retractable mechanical member 201 and the second retractable mechanical member 202) are configured to extend or retract in a direction parallel to the body front 111 (or a direction parallel to the body rear 112), thereby driving the flexible display screen 120 to move between the body front 111 and the body rear 112 along the first edge 113 and the second edge 114, respectively.

As an example of this embodiment, the first retractable mechanical member 201 is disposed at the first edge 113 of the body front 111. The first retractable mechanical member 201 may be extended or retracted in a direction parallel to the body front 111, thereby driving the flexible display screen 120 to move along the first edge 113 (for example, from the body front 111 to the body rear 112 (e.g., the first region 112a), or from the body rear 112 (e.g., the first region 112a) to the body front 111). As another example of this embodiment, the second retractable mechanical member 202 is disposed at the second edge 114 of the body front 111. The second retractable mechanical member 202 is extended or retracted in a direction parallel to the body front 111, thereby driving the flexible display screen 120 to move on the body front 111 and the body rear 112 along the second edge 114 (for example, from the body front 111 to the body rear 112 (e.g., the second region 112c), or from the body rear 112 (e.g., the second region 112c) to the body front 111).

According to some embodiments of the present disclosure, when the retractable mechanical members (for example, including the first retractable mechanical member 201 and the second retractable mechanical member 202) are switched between an outwardly extended state and an inwardly retracted state, the retractable mechanical member may include at least one of the two following driving modes.

First, an external force driving mode. The external force driving mode may be that the retractable mechanical member 200 is switched among the stationary state, the outwardly extended state and the inwardly retracted state under the driving of the external force, and the external force may be a driving force triggered by a user's hand (the external force driving mode may be called a manual retracting mode).

Second, an electric drive component driving mode. The electric drive component driving mode may be that an electric drive component is provided in the retractable mechanical member 200. The electric drive component may be configured to drive the retractable mechanical member 200 to switch among a stationary state, an outwardly extended state, and an inwardly retracted state, according to a user operation (e.g., a touch operation) received on the flexible display screen 120, or a system control signal generated by an operating system, or a program control signal generated by an application program.

The external force driving mode is taken as an example to describe the extension and retraction processes of the retractable mechanical member.

When the user applies a rightward external force on the flexible display screen at a position corresponding to the second retractable mechanical member 202 in FIG. 3 (for example, the user outwardly pulls the right edge of the flexible display screen), the second retractable mechanical member 202 is in an outwardly extended state under the driving of the external force. At this point, the second retractable mechanical member 202 may drive the display region of the flexible display screen 120 located on the body rear 112 to move from the body rear 112 (e.g., the second region 112*c*) to the body front 111 along the second edge 114 under the external force.

Figure 12:
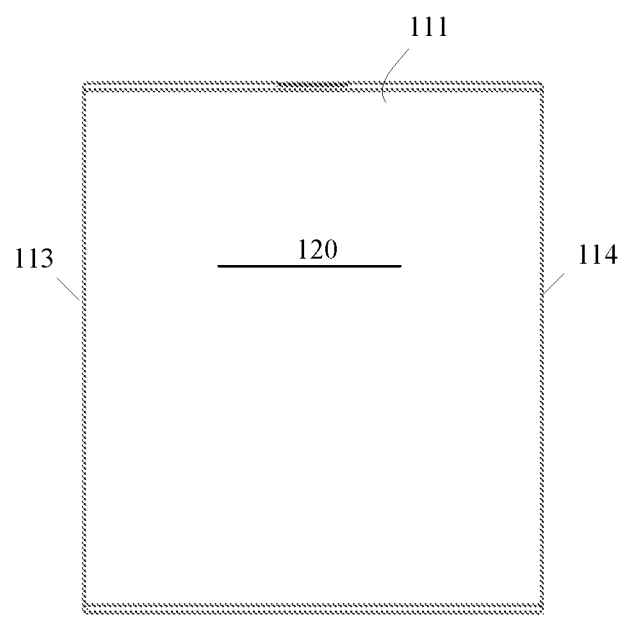
FIG. 12 is a front view of a terminal in a second form provided by some embodiments of the present disclosure.
Figure 13:
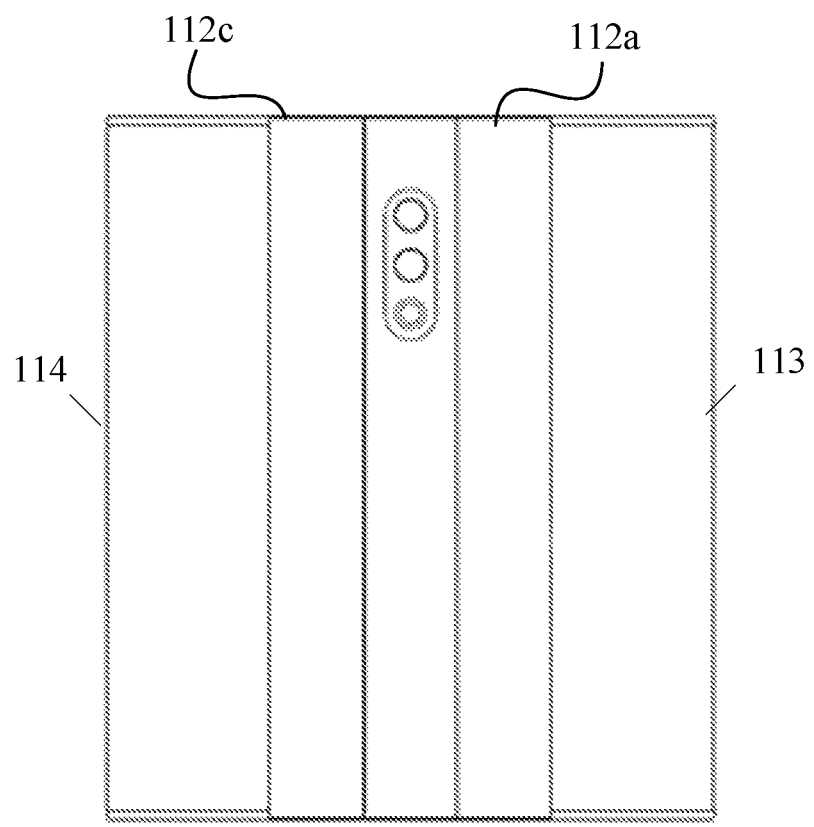
FIG. 13 is a rear view of a terminal in a second form provided by some embodiments of the present disclosure.
Figure 14:
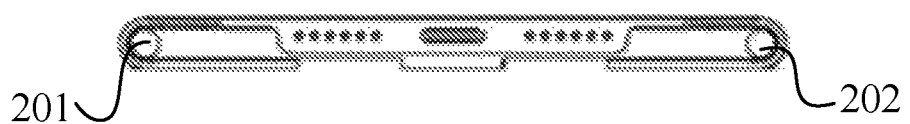
Figure 15:
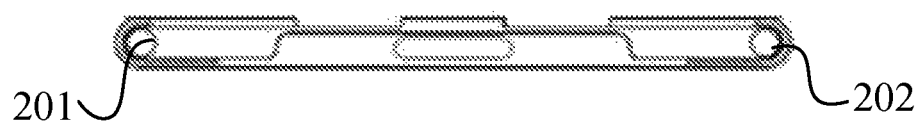
FIG. 15 is a top view of a terminal in a second form provided by some embodiments of the present disclosure.
Figure 16:
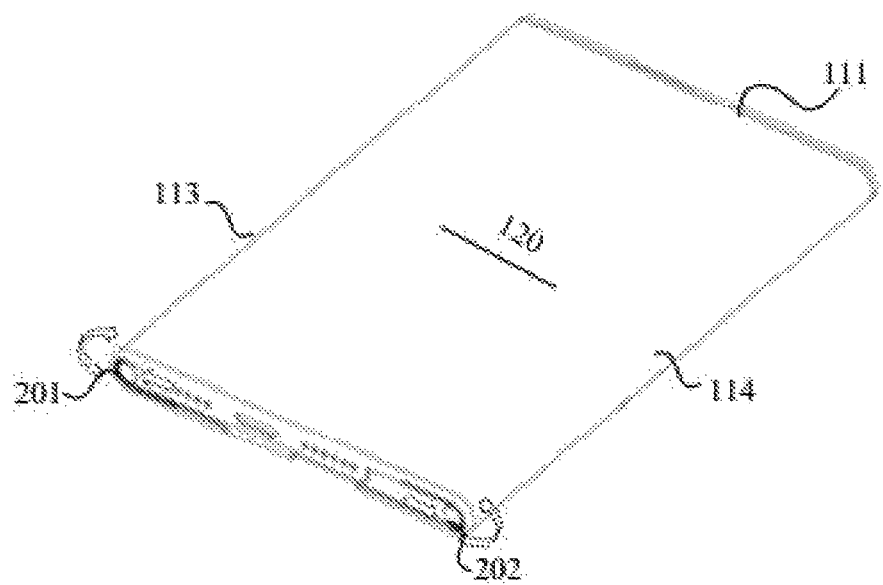
FIG. 16 is a front perspective view of a terminal in a second form provided by some embodiments of the present disclosure.
Figure 17:
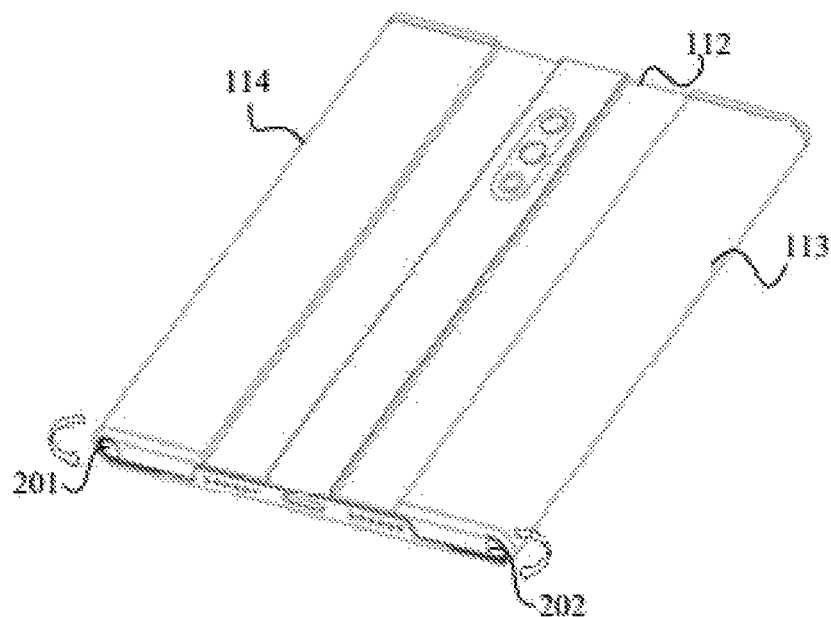
FIG. 17 is a rear perspective view of a terminal in a second form provided by some embodiments of the present disclosure.

When the user applies a leftward external force on the flexible display screen at a position corresponding to the second retractable mechanical member 202 in FIG. 12 (for example, the user inwardly pushes the right edge of the flexible display screen), the second retractable mechanical member 202 is retracted inwardly under the external force. At this point, the second retractable mechanical member 200 may drive the display region of the flexible display screen 120 located on the body front 111 to move from the body front 111 to the body rear 112 (e.g., the second region 112*c*) along the second edge 114 under the external force.

It can be understood that the principle of the external force driving mode of the first retractable mechanical member 201 is the same as that of the external force driving mode of the second retractable mechanical member 202. For example, when the user applies a leftward external force on the flexible display screen at a position corresponding to the first retractable mechanical member 201 in FIG. 3 (for example, the user outwardly pulls the left edge of the flexible display screen), the first retractable mechanical member 201 is extended outwardly under the external force. Correspondingly, when the user applies a rightward external force on the flexible display screen at a position corresponding to the first retractable mechanical member 201 in FIG. 12 (for example, the user inwardly pushes the left edge of the flexible display screen), the first retractable mechanical member 201 is retracted inwardly under the external force.

It can be seen that, the terminal provided by this embodiment enables the retractable mechanical member to vary or switch among a stationary state, an outwardly extended state, and an inwardly retracted state by the external force driving mode, thereby enabling the area of the display region of the flexible display screen on the body front to be increased or decreased, and meeting user's needs according to the actual situations, and the operation mode is simple and more reliable.

Taking the electric drive component driving mode as an example, the extension and retraction processes of the retractable mechanical member (for example, including the first retractable mechanical member 201 and the second retractable mechanical member 202) will be described hereinafter.

Taking a video playing process in a video playing program as an example, a screen zooming-in option may be displayed in the video playing interface. When a user selects the screen zooming-in option (for example, presses a virtual button, or a gesture is sensed), the electric drive component is triggered and may drive the first retractable mechanical member 201 to the outwardly extended state, thereby driving the display region of the flexible display screen 120 located on the body rear 112 to move from the body rear 112 to the body front 111 along the first edge 113. Alternatively, the electric drive component may drive the second retractable mechanical member 202 to the outwardly extended state, thereby driving the display region of the flexible display screen 120 located on the body rear 112 to move from the body rear 112 to the body front 111 along the second edge 114.

Further, for example, a screen zooming-out option may be displayed in the video playing interface. When the user selects the screen zooming-out option, the electric drive component is triggered and may drive the first retractable mechanical member 201 to the inwardly retracted state, thereby driving the display region of the flexible display screen 120 located on the body front 111 to move from the body front 111 to the body rear 112 along the first edge 113. Alternatively, the electric drive component may drive the second retractable mechanical member 202 to the inwardly retracted state, thereby driving the display region of the flexible display screen 120 located on the body front 111 to move from the body front 111 to the body rear 112 along the second edge 114.

As an example of this embodiment, the above-mentioned electric drive component may be automatically controlled by an operating system or an application program, for example an operating system automatically generates a system control signal according to a program currently in a running state to control the electric drive component, or an application program automatically generates a program control signal according to a function currently in a running state to control the electric drive component. As an example of this embodiment, the operating system may detect the user's holding mode through a touch signal received on the flexible display screen. For example, when the left-handed holding mode is used, the operating system may automatically control the second retractable mechanical member to be in the outwardly extended state, and when the right-handed holding mode is used, the operating system may automatically control the first retractable mechanical member to be in the outwardly extended state. It can be understood that the specific generation logic of the system control signal and the program control signal is not limited by the embodiments of the present disclosure. As an example of this embodiment, the above-mentioned electric drive component may independently drive the retractable mechanical member to switch among three states, and may drive the retractable mechanical member in cooperation with the external force driving mode. As an example of this embodiment, the operating system may start the electric drive component according to the force received by the retractable mechanical member, so as to assist the user's extension and retraction operations. For example, during the video playing, when the retractable mechanical member receives the external force in a direction from the inside of the body toward the outside of the body, the operating system starts the electric drive component to drive the retractable mechanical member, so that the retractable mechanical member is in the outwardly extended state. When the retractable mechanical member receives the external force in a direction from the outside of the body toward the inside of the body, the operating system starts the electric drive component to drive the retractable mechanical member, so that the retractable mechanical member is in the inwardly retracted state.

In addition, it can be understood that the principle of the electric drive component driving mode of the first retractable mechanical member 201 is the same as that of the electric drive component driving mode of the second retractable mechanical member 202. As an example, the first retractable mechanical member 201 and the second retractable mechanical member 202 may simultaneously extend or retract under the driving of an electric drive component.

Thus, it can be seen that the electric drive component provided by this embodiment may be controlled by a user operation received on the flexible display screen, or a system control signal generated by the operating system, or a program control signal generated by the application program, thus driving the retractable mechanical member to be switched among an outwardly extended state, an inwardly retracted state, and a stationary state. Compared with the external force driving mode, the electric drive component driving mode is more flexible and intelligent. For example, when only one-handed operation is available, the user only needs to press the virtual button on the flexible display screen or make corresponding gesture and the user can realize the switch among the above-mentioned three states for the retractable mechanical member, that is, it also realizes the change of the area of the display region of the flexible display screen on the body front, which is very convenient. As another example, it may also be set that no user operation is needed, but the operating system and application program may self-control the switch among the states of the retractable mechanical member.

Figure 18:
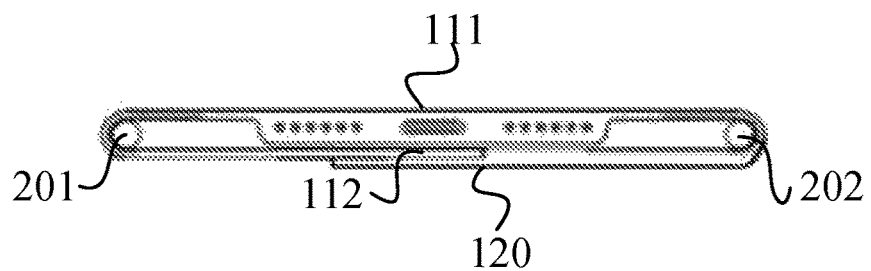
FIG. 18 is a schematic diagram showing a distribution state of a flexible display screen on a body rear of a terminal provided by another exemplary embodiment of the present disclosure.
Figure 19:
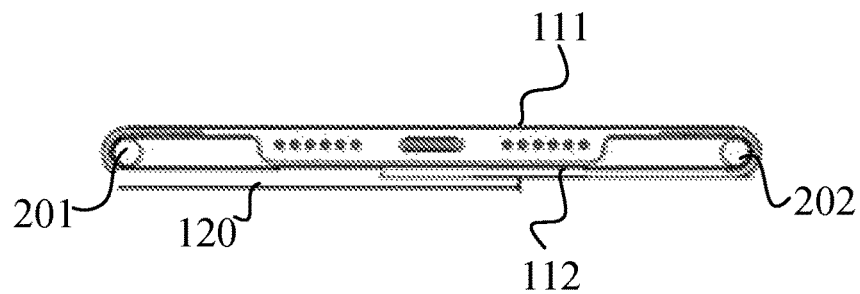
FIG. 19 is a schematic diagram showing another distribution state of a flexible display screen on a body rear of a terminal provided by another exemplary embodiment of the present disclosure.

As an alternative example of this embodiment, the above-mentioned intermediate region 112b is an optional design. In the case that the intermediate region 112b is omitted, as shown in FIG. 18, when the area of the first display region (i.e., left side) of the flexible display screen 120 located on the body rear 112 is less than the area of the second display region (i.e., right side), the second display region may cover the surface of the first display region to achieve a smaller body volume. According to another embodiment, when the area of the first display region (i.e., left side) of the flexible display screen 120 located on the body rear 112 is greater than the area of the second display region (i.e., right side), as shown in FIG. 19, the first display region may cover the surface of the second display region to achieve a smaller body volume.

The extended and retracted states of the first retractable mechanical member 201 and the second retractable mechanical member 202 mentioned in the above embodiments may be set according to actual needs. As an example, the extension or retraction of the first retractable mechanical member 201 and the second retractable mechanical member 202 may be synchronized. As another example, the extension or retraction of the first retractable mechanical member 201 and the second retractable mechanical member 202 may be independent of each other. According to the embodiment of the present disclosure, when the extended and retracted states of the first retractable mechanical member 201 and the second retractable mechanical member 202 are switched synchronously, at least one of the two following cases may be included.

First, in a case that the first retractable mechanical member 201 is in an outwardly extended state, the second retractable mechanical member 202 is also in an outwardly extended state simultaneously.

Second, in a case that the first retractable mechanical member 201 is in an inwardly retracted state, the second retractable mechanical member 202 is also in an inwardly retracted state simultaneously.

According to an example of this embodiment, the extension and retraction processes of the second retractable mechanical member 202 driven by the external force are described below as an example.

When the user applies a rightward external force on the flexible display screen 120 at a position corresponding to the second retractable mechanical member 202 in FIG. 3 (for example, the user outwardly pulls the right edge of the flexible display screen), the second retractable mechanical member 202 is in the outwardly extended state under the driving of the external force. At this point, the second retractable mechanical member 202 may drive the display region of the flexible display screen 120 located on the body rear 112 to move from the body rear 112 (e.g., the second region 112c) to the body front 111 along the second edge 114 under the driving of the external force.

When the user applies a leftward external force on the flexible display screen 120 at a position corresponding to the second retractable mechanical member 202 in FIG. 12 (for example, the user inwardly pushes the right edge of the flexible display screen), the second retractable mechanical member 202 is in the inwardly retracted state under the driving of the external force. At this point, the second retractable mechanical member 202 may drive the display region of the flexible display screen 120 located on the body front 111 to move from the body front 111 to the body rear 112 (e.g., the second region 112c) along the second edge 114 under the driving of the external force.

It can be understood that the external force driving mode of the first retractable mechanical member 201 has the same principle as that of the external force driving mode of the second retractable mechanical member 202. For example, when the user applies a leftward external force on the flexible display screen 120 at a position corresponding to the first retractable mechanical member 201 in FIG. 3 (for example, the user outwardly pulls the left edge of the flexible display screen), the first retractable mechanical member 201 is in the outwardly extended state under the driving of the external force. Correspondingly, when the user applies a rightward external force on the flexible display screen 120 at a position corresponding to the first retractable mechanical member 201 in FIG. 12 (for example, the user inwardly pushes the left edge of the flexible display screen), the first retractable mechanical member 201 is in the inwardly retracted state under the driving of the external force.

It can be understood that the first retractable mechanical member 201 and the second retractable mechanical member 202 may simultaneously perform the extension or retraction process under the driving of an external force.

According to the embodiment of the present disclosure, in a case that the first retractable mechanical member 201 and the second retractable mechanical member 202 switch the extended and retracted states independently of each other, there may be, for example, at least one of the following nine cases:

First, the first retractable mechanical member 201 is in an outwardly extended state, and the second retractable mechanical member 202 is in an outwardly extended state.

Second, the first retractable mechanical member 201 is in an outwardly extended state, and the second retractable mechanical member 202 is in an inwardly retracted state.

Third, the first retractable mechanical member 201 is in an outwardly extended state, and the second retractable mechanical member 202 is in a stationary state.

Fourth, the first retractable mechanical member 201 is in an inwardly retracted state, and the second retractable mechanical member 202 is in an outwardly extended state.

Fifth, the first retractable mechanical member 201 is in an inwardly retracted state, and the second retractable mechanical member 202 is in an inwardly retracted state.

Sixth, the first retractable mechanical member 201 is in an inwardly retracted state, and the second retractable mechanical member 202 is in a stationary state.

Seventh, the first retractable mechanical member 201 is in a stationary state, and the second retractable mechanical member 202 is in an outwardly extended state.

Eighth, the first retractable mechanical member 201 is in a stationary state, and the second retractable mechanical member 202 is in an inwardly retracted state.

Ninth, the first retractable mechanical member 201 is in a stationary state, and the second retractable mechanical member 202 is in a stationary state.

It can be seen that the first retractable mechanical member 201 and the second retractable mechanical member 202 provided by this embodiment may switch the extended and retracted states synchronously or independently of each other. When the first retractable mechanical member 201 and the second retractable mechanical member 202 extend or retract synchronously, the areas of the first display region and the second display region of the flexible display screen on the body front synchronously increase or decrease. When the first retractable mechanical member 201 and the second retractable mechanical member 202 extend or retract independently of each other, the areas of the first display region and the second display region of the flexible display screen on the body front increase or decrease independently of each other.

Figure 20:
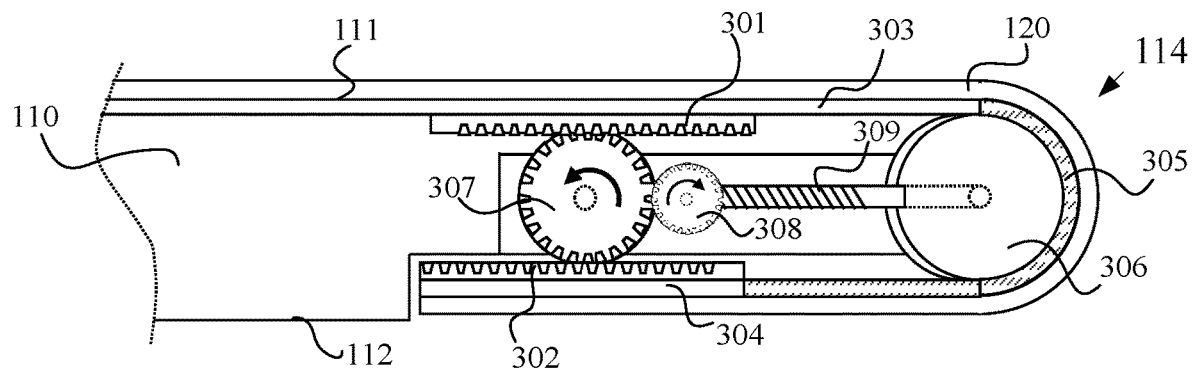
FIG. 20 is a schematic structural diagram of a retractable mechanical member of a terminal provided by some embodiments of the present disclosure.

FIG. 20 shows a structural block diagram of a retractable mechanical member 200 provided by some embodiments of the present disclosure. However, the specific implementation structure of the retractable mechanical member of the present disclosure is not limited to this. The retractable mechanical member 200 shown in FIG. 20 includes an electric drive component, a first screen support housing 303 disposed on an inside of a screen region (i.e., a portion of the flexible display screen 120 in FIG. 20) located at the body front 111, a second screen support housing 304 disposed on an inside of a screen region (i.e., a portion of the flexible display screen 120 in FIG. 20) located at the body rear 112, and a flexible backing material 305 (or referred as a flexible backing piece made of a flexible backing material) disposed between a sliding support shaft 306 and a screen region (i.e., a portion of the flexible display screen 120 in FIG. 20) at the edge.

As shown in FIG. 20, the electric drive component includes: a first rack 301, a second rack 302, a sliding support shaft 306, a gear 307, a motor gear 308, and a connecting rod 309.

According to some embodiments of the present disclosure, the first rack 301 is disposed on the inside of the screen region located at the body front 111. The second rack 302 is disposed on the inside of the screen region located at the body rear 112. The first rack 301 meshes with the side of the gear 307 facing the body front 111, and the second rack 302 meshes with the side of the gear 307 facing the body rear 112. The motor gear 308 meshes with the side of the gear 307 facing the edge (for example, the edge between the body front 111 and the body rear 112). The motor gear 308 is drivingly connected to one end of the connecting rod 309, and the other end of the connecting rod 309 is connected to the sliding support shaft 306.

According to some embodiments of the present disclosure, the motor gear 308 is used to drive the gear 307 to rotate, so that the second rack 302 moves in a direction parallel to the body rear 112 and from the inside of the body toward the outside of the body (for example, a direction from left to right in FIG. 20). At the same time, the motor gear 308 also drives the connecting rod 309 to move in a direction parallel to the body rear 112 and from the inside of the body toward the outside of the body. Because the sliding support shaft 306 cannot rotate, the connecting rod 309 also drives the sliding support shaft 306 to move in a direction parallel to the body rear 112 and from the inside of the body toward the outside of the body.

According to some embodiments of the present disclosure, the sliding support shaft 306 may be disposed on an inside of the screen region located at said edge (e.g., the edge between the body front 111 and the body rear 112), and the edge may be the opposite first edge 113 or second edge 114 on the body front 111.

According to some embodiments of the present disclosure, the sliding support shaft 306 may be covered with the flexible backing material 305. As an example, the sliding support shaft 306 is not rotatable.

As shown in FIG. 20, the body 110 in the embodiment of the present disclosure is a skeletal part constituting the terminal body. The body 110 may include a body front 111 and a body rear 112. As an example of this embodiment, in a case that the terminal is a mobile phone, the body 110 includes a middle frame and a rear cover portion located at the central region 112b.

The first screen support housing 303 may be fixed to the body 110 at the upper and lower edges of the terminal. As an example, a portion of the first screen support housing 303 facing the outside of the body (i.e., the right portion of the first screen support housing 303 in FIG. 20) supports the display region of the flexible display screen 120 located at the body front 111, and a portion of the first screen support housing 303 facing the inside of the body (i.e., a left portion of the first screen support housing 303 in FIG. 20) may be provided with the fixed first rack 301. In this embodiment, because the first rack 301 is fixed relative to the body 110, the first rack 301 cannot move relative to the body 110.

According to some embodiments of the present disclosure, the body 110 is provided with a first chute at an upper edge and a lower edge of the terminal, and the second screen support housing 304 is installed in the first chute. The second screen support housing 304 may move in the first chute in a direction parallel to the body rear 112 and from the inside of the body toward the outside of the body (or from the outside of the body toward the inside of the body).

As an example, the gear 307 may be sandwiched between the first screen support housing 303 and the second screen support housing 304 inside the body 110. The gear 307 and the motor gear 308 are movable relative to the body 110. In one possible design, bearing portions of the gear 307 and the motor gear 308 are suspended. In another possible design, a second chute is also provided in the body 110 and is parallel to the body rear (or the body front), and the bearing portions of the gear 307 and the motor gear 308 are installed in the second chute. That is, the gear 307, the motor gear 308, and the second screen support housing 304 are all slidably installed with the body 110, so that the second screen support housing 304 may slide in the left-right direction relative to the body 110. A portion of the second screen support housing 304 facing the outside of the body (i.e., the right portion of the second screen support housing 304 in FIG. 20) supports the display region of the flexible display screen 120 located on the body rear 112, and a portion of the second screen support housing 304 facing the inside of the body (i.e., the left portion of the second screen support housing 304 in FIG. 20) is provided with the fixed second rack 302.

Regarding the action process of the retractable mechanical member in FIG. 20, the extension and retraction processes of driving the second retractable mechanical member 202 by the electric drive component are described below as an example, assuming that the right edge in FIG. 20 is the second edge 114.

In the electric drive component driving mode, the motor gear 308 may rotate in the direction (i.e., clockwise) shown in FIG. 20, for example, under the driving of electric power. Because the motor gear 308 meshes with the side of the gear 307 facing the second edge 114, the motor gear 308 may drive the gear 307 to rotate in the direction (i.e., counterclockwise) shown in FIG. 20. Because the gear 307 simultaneously meshes with the first rack 301 provided inside the screen region on the body front 111 and the second rack 302 provided inside the screen region on the body rear 112, and the first rack 301 is fixed (because it is disposed on the inside of the screen region on the body front 111 and is fixed on the first screen support housing 303, i.e., equivalent to being fixed on the body 110), the gear 307 drives the movable second rack 302 to move in a direction parallel to the body rear 112, i.e., in a rightward direction toward the second edge 114 in FIG. 20. At this point, the motor gear 308 drives the connecting rod 309 to move in a direction parallel to the body rear 112, i.e., in a rightward direction toward the second edge 114 in FIG. 20. Moreover, because the sliding support shaft 306 is not rotatable, the connecting rod 309 may drive the sliding support shaft 306 to move in the rightward direction in FIG. 20, so that the second retractable mechanical member 202 is in the outwardly extended state. In this way, the second retractable mechanical member 202 may drive the display region of the flexible display screen 120 located on the body rear 112 to move from the body rear 112 to the body front 111 along the second edge 114.

As an example, when the second retractable mechanical member 202 outwardly extends, the moving speed of the second rack 302 may be twice the moving speed of the sliding support shaft 306, and the total area of the flexible display screen 120 is unchanged in the extension process.

Correspondingly, in the electric drive component driving mode, if the motor gear 308 rotates in the direction (i.e., counterclockwise) opposite to that shown in FIG. 20, because the motor gear 308 meshes with the side of and the gear 307 facing the second edge, the motor gear 308 drives the gear 307 to rotate in the direction (i.e., clockwise) opposite to that shown in FIG. 20. Because the gear 307 meshes with the first rack 301 and the second rack 302 simultaneously, and the first rack 301 is fixed, the gear 307 may drive the second rack 302 to move in a direction parallel to the body rear 112, i.e., in the leftward direction away from the second edge 114 in FIG. 20. At this point, the motor gear 308 may drive the connecting rod 309 to move in a direction parallel to the body rear 112, i.e., in a leftward direction away from the second edge 114 in FIG. 20. Moreover, because the sliding support shaft 306 is not rotatable, the connecting rod 309 may drive the sliding support shaft 306 to move in the leftward direction in FIG. 20, so that the second retractable mechanical member 202 is in the inwardly retracted state. In this way, the second retractable mechanical member 202 may drive the display region of the flexible display screen 120 located on the body front 111 to move from the body front 111 to the body rear 112 along the second edge 114.

As an example, when the second retractable mechanical member 202 inwardly retracts, the moving speed of the second rack 302 may be twice the moving speed of the sliding support shaft 306, and the total area of the flexible display screen 120 is unchanged in the retraction process.

According to the above introduction about the structure of the retractable mechanical member, compared with a foldable mobile phone realized by using the hinge-type design (for example, a complex hinge design in a folded region), the structure of the retractable mechanical member provided by this embodiment is simpler, and has higher reliability and durability. Moreover, because the second edge 114 may be designed as a semi-circular curved surface, the flexible display screen 120 may be realized to be curved in a manner of a smooth constant curvature, which may slow down the aging speed of the flexible display screen.

The retractable mechanical member provided by this embodiment may also be provided with a flexible backing material (the diagonal shaded portion in FIG. 20), by which the display region that needs to be bent is supported. Therefore, the display region that needs to be bent is uniformly stressed during the bending process, thereby further slowing down the aging speed of the flexible display screen.

According to some embodiments of the present disclosure, the extended and retracted states of the second retractable mechanical member 202 may be switched by an electric drive component. As an alternative embodiment, in actual operation, the extended and retracted states of the second retractable mechanical member 202 may be switched by an external force. When the external force driving mode is adopted, the second retractable mechanical member 202 may be implemented by a similar structure in which the motor gear 308 is replaced by a gear with the same size as the motor gear 308, which will not be repeated here.

In the above examples, the extension and retraction processes of the second retractable mechanical member 202 are described as an example. It can be understood that the principle of the extension and retraction processes of the first retractable mechanical member 201 is the same as that of the extension and retraction processes of the second retractable mechanical member 202, which will not be repeated here.

As an example of this embodiment, a plurality of parallel first retractable mechanical members 201 may be provided at the first edge, so that the flexible display screen 120 is uniformly stressed when moving at the first edge. A plurality of parallel second retractable mechanical members 202 may be provided at the second edge, so that the flexible display screen 120 is uniformly stressed when moving at the second edge.

It can be understood that the flexible backing material 305 in the retractable mechanical member in the embodiment of the present disclosure may be extended according to the extension needs of the flexible display screen. The length of the second rack 302 in the retractable mechanical member in the embodiment of the present disclosure may be set as short as possible within the allowable range, so that the second rack 302 has a longer moving range, thereby achieving extending the range of the increased area of the display region of the flexible display screen 120 on the body front 111.

Figure 21:
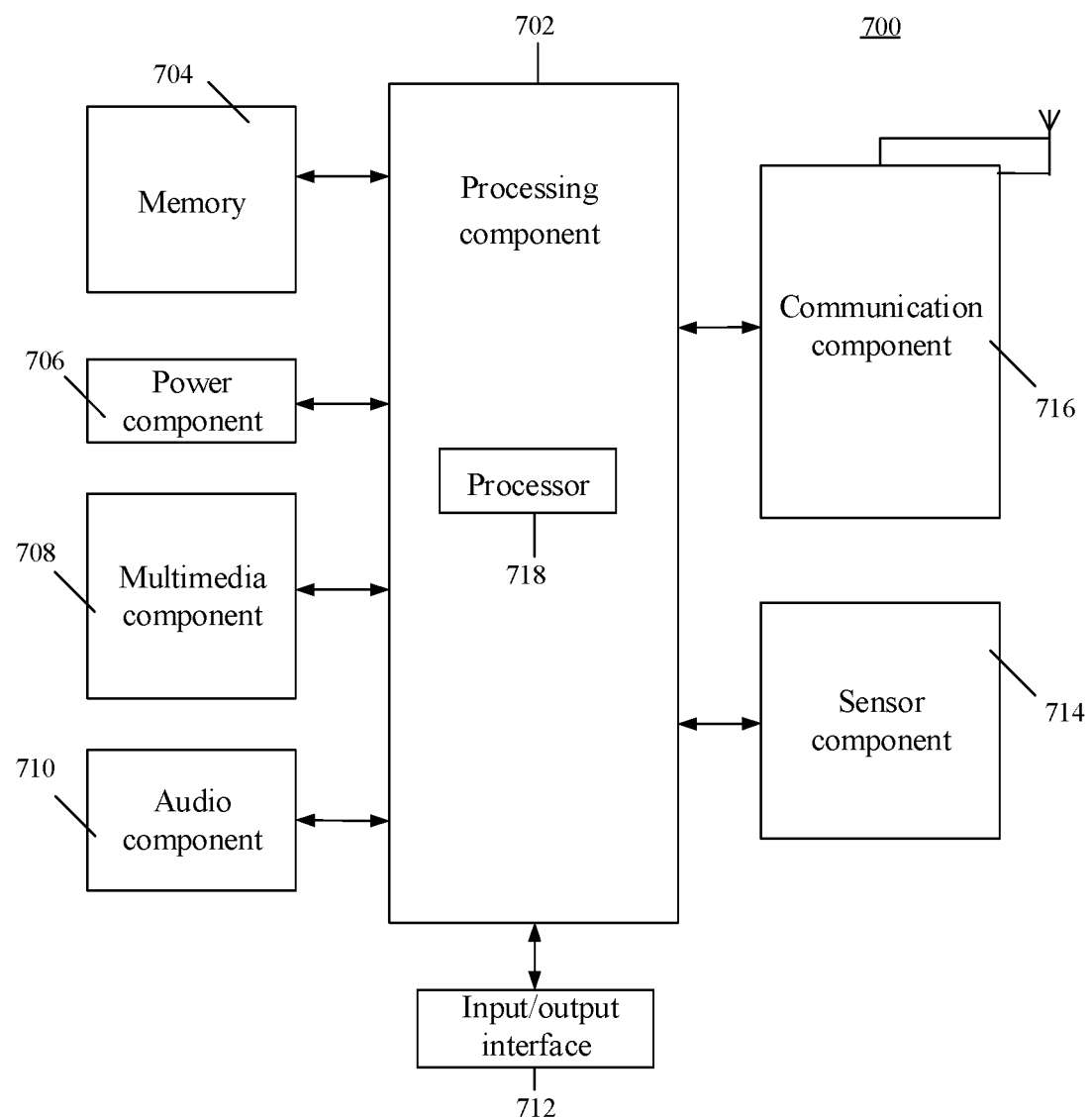
FIG. 21 is a schematic block diagram of a terminal provided by some embodiments of the present disclosure.

The terminal mentioned in the above embodiments of the present disclosure may be a mobile phone, a computer, a digital broadcast terminal, a message transceiver device, a game console, a tablet device, a piece of medical equipment, a piece of fitness equipment, a personal digital assistant, or the like. FIG. 21 is a block diagram showing a terminal 700 according to some embodiments of the present disclosure. For example, the terminal 700 may be a mobile phone, a computer, a digital broadcast terminal, a message transceiver device, a game console, a tablet device, a piece of medical equipment, a piece of fitness equipment, a personal digital assistant, or the like.

Referring to FIG. 21, the terminal 700 may include one or more of the following components: a processing component 702, a memory 704, a power component 706, a multimedia component 708, an audio component 710, an input/output (I/O) interface 712, a sensor component 714, and a communication component 716.

The processing component 702 typically controls overall operations of the terminal 700, such as the operations associated with display, telephone calls, data communications, camera operations, and recording operations. The processing component 702 may include one or more processors 720 to execute instructions to perform all or part of the steps in the above described methods. Moreover, the processing component 702 may include one or more modules which facilitate the interaction between the processing component 702 and other components. For instance, the processing component 702 may include a multimedia module to facilitate the interaction between the multimedia component 708 and the processing component 702.

The memory 704 is configured to store various types of data to support the operation of the terminal 700. Examples of such data include instructions for any applications or methods operated on the terminal 700, contact data, phonebook data, messages, pictures, video, etc. The memory 704 may be implemented using any type of volatile or non-volatile memory devices, or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic or optical disk.

The power component 706 provides power to various components of the terminal 700. The power component 706 may include a power management system, one or more power sources, and any other components associated with the generation, management, and distribution of power in the terminal 700.

The multimedia component 708 includes a screen providing an output interface between the terminal 700 and the user. In some embodiments, the screen may include a liquid crystal display (LCD) and a touch panel (TP). In some embodiments, organic light-emitting diode (OLED) or other types of displays can be employed.

If the screen includes the touch panel, the screen may be implemented as a touch screen to receive input signals from the user. The touch panel includes one or more touch sensors to sense touches, slips, and gestures on the touch panel. The touch sensors may not only sense a boundary of a touch or slip action, but also sense a period of time and a pressure associated with the touch or slip action. In some embodiments, the multimedia component 708 includes a front camera and/or a rear camera. The front camera and the rear camera may receive an external multimedia datum while the terminal 700 is in an operation mode, such as a photographing mode or a video mode. Each of the front camera and the rear camera may be a fixed optical lens system or have focus and optical zoom capability.

The audio component 710 is configured to output and/or input audio signals. For example, the audio component 710 includes a microphone ("MIC") configured to receive an external audio signal when the terminal 700 is in an operation mode, such as a call mode, a recording mode, and a voice recognition mode. The received audio signal may be further stored in the memory 704 or transmitted via the communication component 716. In some embodiments, the audio component 710 further includes a speaker to output audio signals.

The I/O interface 712 provides an interface between the processing component 702 and peripheral interface modules, such as a keyboard, a click wheel, buttons, and the like. The buttons may include, but are not limited to, a home button, a volume button, a starting button, and a locking button.

The sensor component 714 includes one or more sensors to provide status assessments of various aspects of the terminal 700. For instance, the sensor component 714 may detect an open/closed status of the terminal 700, relative positioning of components, e.g., the display and the keypad, of the terminal 700, a change in position of the terminal 700 or a component of the terminal 700, a presence or absence of user contact with the terminal 700, an orientation or an acceleration/deceleration of the terminal 700, and a change in temperature of the terminal 700. The sensor component 714 may include a proximity sensor configured to detect the presence of nearby objects without any physical contact. The sensor component 714 may also include a light sensor, such as a CMOS or CCD image sensor, for use in imaging applications. In some embodiments, the sensor component 714 may also include an accelerometer sensor, a gyroscope sensor, a magnetic sensor, a pressure sensor, or a temperature sensor.

The communication component 716 is configured to facilitate communication, wired or wirelessly, between the terminal 700 and other devices. The terminal 700 may access a wireless network based on a communication standard, such as Wi-Fi, 2G, 3G, 4G, or 5G, or a combination thereof. In one exemplary embodiment, the communication component 716 receives a broadcast signal or broadcast associated information from an external broadcast management system via a broadcast channel. In one exemplary embodiment, the communication component 716 further includes a near field communication (NFC) module to facilitate short-range communications.

In some embodiments, the terminal 700 may be implemented with one or more application specific integrated circuits (ASICs), digital signal processors (DSPs), digital signal processing devices (DSPDs), programmable logic devices (PLDs), field programmable gate arrays (FPGAs), controllers, micro-controllers, microprocessors, or other electronic components.

In some embodiments, there is also provided a non-transitory computer-readable storage medium including instructions, such as instructions included in the memory 704 and executable by the processor 720 in the terminal 700, for controlling a contractable mechanical member to switch among a stationary state, an outwardly extended state and an inwardly contracted state. For example, the non-transitory computer-readable storage medium may be a ROM, a RAM, a CD-ROM, a magnetic tape, a floppy disc, an optical data storage device, or the like.

Various embodiments of the present disclosure therefore provide a terminal that can have improved user experience. The terminal includes: a body including a body front and a body rear; a flexible display screen extending from the body front to the body rear; and a retractable mechanical member provided at an edge between the body front and the body rear and located on an inside of the flexible display screen; wherein, the retractable mechanical member is configured to drive a display region of the flexible display screen located on the body rear to move from the body rear to the body front along the edge, when the retractable mechanical member is in an outwardly extended state; the retractable mechanical member is configured to drive a display region of the flexible display screen located on the body front to move from the body front to the body rear along the edge, when the retractable mechanical member is in an inwardly retracted state.

In some embodiments of the present disclosure, the edge includes one edge of the body front; or, the edge includes a first edge and a second edge opposite to each other on the body front.

In some embodiments of the present disclosure, the body rear includes a first region, an intermediate region, and a second region; the flexible display screen includes a first display region configured to be curved along the first edge of the body front to cover the first region of the body rear; and the flexible display screen includes a second display region configured to be curved along the second edge of the body front to cover the second region of the body rear.

In some embodiments of the present disclosure, the first region and the second region are symmetrically disposed with the intermediate region as a center.

In some embodiments of the present disclosure, the intermediate region is provided with at least one of a camera, a flash, a fingerprint sensor, an optical sensor, and a distance sensor.

In some embodiments of the present disclosure, the retractable mechanical member is configured to be switchable among a stationary state, the outwardly extended state, and the inwardly retracted state under a driving of an external force.

In some embodiments of the present disclosure, the retractable mechanical member is further provided with an electric drive component; and the electric drive component is configured to drive the retractable mechanical member to switch among a stationary state, the outwardly extended state, and the inwardly retracted state according to a user operation received on the flexible display screen, a system control signal generated by an operating system, or a program control signal generated by an application program.

In some embodiments of the present disclosure, the electric drive component includes a first rack, a second rack, a sliding support shaft, a gear, a motor gear, and a connecting rod; wherein, the first rack is disposed on an inside of a screen region located at the body front, the second rack is disposed on an inside of a screen region located at the body rear, and the sliding support shaft is disposed on an inside of a screen region located at the edge; the first rack meshes with a side of the gear facing the body front, the second rack meshes with a side of the gear facing the body rear, and the motor gear meshes with a side of the gear facing the edge; the motor gear is further drivingly connected to one end of the connecting rod, and the other end of the connecting rod is connected to the sliding support shaft; and the motor gear is configured to drive the gear, such that the second rack moves in a direction parallel to the body rear and the connecting rod and the sliding support shaft move in the direction parallel to the body rear.

In some embodiments of the present disclosure, a moving speed of the second rack is twice a moving speed of the sliding support shaft.

In some embodiments of the present disclosure, the retractable mechanical member further includes: a first screen support housing disposed on the inside of the screen region located at the body front; and a second screen support housing disposed on the inside of the screen region located at the body rear; wherein the first rack is fixed to the first screen support housing and the second rack is fixed to the second screen support housing.

In some embodiments of the present disclosure, the retractable mechanical member further includes a flexible backing material and the flexible backing material is disposed between the sliding support shaft and the screen region at the edge.

In some embodiments of the present disclosure, the retractable mechanical member is configured to extend or retract in a direction parallel to the body front.

In some embodiments of the present disclosure, the edge includes a first edge and a second edge; the retractable mechanical member includes a first retractable mechanical member corresponding to the first edge, and a second retractable mechanical member corresponding to the second edge; and the extension and retraction of the first retractable mechanical member and the second retractable mechanical member are synchronized.

The various device components, modules, units, blocks, or portions may have modular configurations, or are composed of discrete components, but nonetheless can be referred to as "modules" in general. In other words, the "components," "modules," "blocks," "portions," or "units" referred to herein may or may not be in modular forms.

In the present disclosure, the terms "installed," "connected," "coupled," "fixed" and the like shall be understood broadly, and can be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

In the description of the present disclosure, the terms "one embodiment," "some embodiments," "example," "specific example," or "some examples," and the like can indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described can be combined in a suitable manner in any one or more embodiments or examples. In addition, various embodiments or examples described in the specification, as well as features of various embodiments or examples, can be combined and reorganized.

In some embodiments, the control and/or interface software or app can be provided in a form of a non-transitory computer-readable storage medium having instructions stored thereon is further provided. For example, the non-transitory computer-readable storage medium can be a ROM, a CD-ROM, a magnetic tape, a floppy disk, optical data storage equipment, a flash drive such as a USB drive or an SD card, and the like.

Implementations of the subject matter and the operations described in this disclosure can be implemented in digital electronic circuitry, or in computer software, firmware, or hardware, including the structures disclosed herein and their structural equivalents, or in combinations of one or more of them. Implementations of the subject matter described in this disclosure can be implemented as one or more computer programs, i.e., one or more portions of computer program instructions, encoded on one or more computer storage medium for execution by, or to control the operation of, data processing apparatus.

Alternatively, or in addition, the program instructions can be encoded on an artificially-generated propagated signal, e.g., a machine-generated electrical, optical, or electromagnetic signal, which is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them.

Moreover, while a computer storage medium is not a propagated signal, a computer storage medium can be a source or destination of computer program instructions encoded in an artificially-generated propagated signal. The computer storage medium can also be, or be included in, one or more separate components or media (e.g., multiple CDs, disks, drives, or other storage devices). Accordingly, the computer storage medium can be tangible.

The operations described in this disclosure can be implemented as operations performed by a data processing apparatus on data stored on one or more computer-readable storage devices or received from other sources.

The devices in this disclosure can include special purpose logic circuitry, e.g., an FPGA (field-programmable gate array), or an ASIC (application-specific integrated circuit). The device can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The devices and execution environment can realize various different computing model infrastructures, such as web services, distributed computing, and grid computing infrastructures.

A computer program (also known as a program, software, software application, app, script, or code) can be written in any form of programming language, including compiled or interpreted languages, declarative or procedural languages, and it can be deployed in any form, including as a stand-alone program or as a portion, component, subroutine, object, or other portion suitable for use in a computing environment. A computer program can, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more portions, sub-programs, or portions of code). A computer program can be deployed to be executed on one computer or on multiple computers that are located at one site or distributed across multiple sites and interconnected by a communication network.

The processes and logic flows described in this disclosure can be performed by one or more programmable processors executing one or more computer programs to perform actions by operating on input data and generating output. The processes and logic flows can also be performed by, and apparatus can also be implemented as, special purpose logic circuitry, e.g., an FPGA, or an ASIC.

Processors or processing circuits suitable for the execution of a computer program include, by way of example, both general and special purpose microprocessors, and any one or more processors of any kind of digital computer. Generally, a processor will receive instructions and data from a read-only memory, or a random-access memory, or both. Elements of a computer can include a processor configured to perform actions in accordance with instructions and one or more memory devices for storing instructions and data.

Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few.

Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, implementations of the subject matter described in this specification can be implemented with a computer and/or a display device, e.g., a VR/AR device, a head-mount display (HMD) device, a head-up display (HUD) device, smart eyewear (e.g., glasses), a CRT (cathode-ray tube), LCD (liquid-crystal display), OLED (organic light emitting diode), or any other monitor for displaying information to the user and a keyboard, a pointing device, e.g., a mouse, trackball, etc., or a touch screen, touch pad, etc., by which the user can provide input to the computer.

Implementations of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components.

The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features can be described above as acting in certain combinations and even initially claimed as such, one or more features from a claimed combination can in some cases be excised from the combination, and the claimed combination can be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the implementations described above should not be understood as requiring such separation in all implementations, and it should be understood that the described program components and systems can generally be integrated together in a single software product or packaged into multiple software products.

As such, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing can be utilized.

It is intended that the specification and embodiments be considered as examples only. Other embodiments of the disclosure will be apparent to those skilled in the art in view of the specification and drawings of the present disclosure. That is, although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

It should be understood that "a plurality" or "multiple" as referred to herein means two or more. "And/or," describing the association relationship of the associated objects, indicates that there may be three relationships, for example, A and/or B may indicate that there are three cases where A exists separately, A and B exist at the same time, and B exists separately. The character "/" generally indicates that the contextual objects are in an "or" relationship.

In the present disclosure, it is to be understood that the terms "lower," "upper," "under" or "beneath" or "underneath," "above," "front," "back," "left," "right," "top," "bottom," "inner," "outer," "horizontal," "vertical," and other orientation or positional relationships are based on example orientations illustrated in the drawings, and are merely for the convenience of the description of some embodiments, rather than indicating or implying the device or component being constructed and operated in a particular orientation. Therefore, these terms are not to be construed as limiting the scope of the present disclosure.

Moreover, the terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

In the present disclosure, a first element being "on" a second element may indicate direct contact between the first and second elements, without contact, or indirect geometrical relationship through one or more intermediate media or layers, unless otherwise explicitly stated and defined. Similarly, a first element being "under," "underneath" or "beneath" a second element may indicate direct contact between the first and second elements, without contact, or indirect geometrical relationship through one or more intermediate media or layers, unless otherwise explicitly stated and defined.

Some other embodiments of the present disclosure can be available to those skilled in the art upon consideration of the specification and practice of the various embodiments disclosed herein. The present application is intended to cover any variations, uses, or adaptations of the present disclosure following general principles of the present disclosure and include the common general knowledge or conventional technical means in the art without departing from the present disclosure. The specification and examples can be shown as illustrative only, and the true scope and spirit of the disclosure are indicated by the following claims.

The invention claimed is:
1. A terminal, comprising
a body comprising a body front and a body rear;
a flexible display screen extending from the body front to the body rear; and
a retractable mechanical member provided at an edge between the body front and the body rear;
wherein the retractable mechanical member is configured to:
drive a display region of the flexible display screen located on the body rear to move from the body rear to the body front along the edge, when the retractable mechanical member is in an outwardly extended state; and
drive a display region of the flexible display screen located on the body front to move from the body front to the body rear along the edge, when the retractable mechanical member is in an inwardly retracted state;
wherein the retractable mechanical member is further provided with an electric drive component; and the electric drive component is configured to drive the retractable mechanical member to switch among a stationary state, the outwardly extended state, and the inwardly retracted state according to a user operation received on the flexible display screen, a system control signal generated by an operating system, or a program control signal generated by an application program;
wherein the electric drive component comprises a first rack, a second rack, a sliding support shaft, a gear, a motor gear and a connecting rod;
the first rack is disposed on an inside of a screen region located at the body front, the second rack is disposed on an inside of a screen region located at the body rear, and the sliding support shaft is disposed on an inside of a screen region located at the edge;
the first rack meshes with a side of the gear facing the body front, the second rack meshes with a side of the gear facing the body rear, and the motor gear meshes with a side of the gear facing the edge;

the motor gear is further drivingly connected to one end of the connecting rod, and the other end of the connecting rod is connected to the sliding support shaft; and the motor gear is configured to drive the gear, such that the second rack moves in a direction parallel to the body rear and the connecting rod and the sliding support shaft move in the direction parallel to the body rear.

2. The terminal according to claim 1, wherein
the edge comprises one edge of the body front; or,
the edge comprises a first edge and a second edge opposite to each other on the body front.

3. The terminal according to claim 2, wherein the body rear comprises a first region, an intermediate region and a second region;
the flexible display screen comprises a first display region configured to be curved along the first edge of the body front to cover the first region of the body rear; and
the flexible display screen comprises a second display region configured to be curved along the second edge of the body front to cover the second region of the body rear.

4. The terminal according to claim 3, wherein the first region and the second region are symmetrically disposed with the intermediate region as a center.

5. The terminal according to claim 3, wherein the intermediate region is provided with at least one of a camera, a flash, a fingerprint sensor, an optical sensor, and a distance sensor.

6. The terminal according to claim 1, wherein the retractable mechanical member is configured to be switchable among a stationary state, the outwardly extended state, and the inwardly retracted state under a driving of an external force.

7. The terminal according to claim 1, wherein a moving speed of the second rack is twice a moving speed of the sliding support shaft.

8. The terminal according to claim 1, wherein the retractable mechanical member further comprises: a first screen support housing disposed on the inside of the screen region located at the body front; and a second screen support housing disposed on the inside of the screen region located at the body rear; and wherein the first rack is fixed to the first screen support housing, and the second rack is fixed to the second screen support housing.

9. The terminal according to claim 1, wherein the retractable mechanical member further comprises a flexible backing material and the flexible backing material is disposed between the sliding support shaft and the screen region at the edge.

10. The terminal according to claim 1, wherein the retractable mechanical member is configured to extend or retract in a direction parallel to the body front.

11. The terminal according to claim 1, wherein the edge comprises a first edge and a second edge;
the retractable mechanical member comprises a first retractable mechanical member corresponding to the first edge, and a second retractable mechanical member corresponding to the second edge; and
the extension and retraction of the first retractable mechanical member and the second retractable mechanical member are synchronized.

12. The terminal according to claim 1, wherein the edge comprises a first edge and a second edge;
the retractable mechanical member comprises a first retractable mechanical member corresponding to the first edge, and a second retractable mechanical member corresponding to the second edge; and
the extension and retraction of the first retractable mechanical member and the second retractable mechanical member are independent of each other.

13. The terminal according to claim 12, further comprising an electric drive component; wherein:
the flexible display screen is configured to display a screen zooming-out option in a video playing interface;
upon the screen zooming-out option being selected, the electric drive component is triggered and configured to:
drive the first retractable mechanical member to an inwardly retracted state, thereby driving the display region of the flexible display screen located on the body front to move from the body front to the body rear along the first edge; or
drive the second retractable mechanical member to the inwardly retracted state, thereby driving the display region of the flexible display screen located on the body front to move from the body front to the body rear along the second edge; and
the terminal is configured to:
detect user's holding mode through a touch signal received on the flexible display screen;
upon a left-handed holding mode is detected, automatically control the second retractable mechanical member to be in the outwardly extended state; and
upon a right-handed holding mode is detected, automatically control the first retractable mechanical member to be in the outwardly extended state, thereby enabling a one-handed operation with the user pressing the virtual button on the flexible display screen or making corresponding gesture, to realize switching among three states for the retractable mechanical member.

14. A retractable mechanical member,
wherein the retractable mechanical member is disposed at an edge of a terminal and located on an inside of a flexible display screen of the terminal, and the flexible display screen extends from a body front of the terminal to a body rear of the terminal; and
the retractable mechanical member is configured to:
drive a display region of the flexible display screen located on the body rear to move from the body rear to the body front along the edge, when the retractable mechanical member is in an outwardly extended state; and
drive a display region of the flexible display screen located on the body front to move from the body front to the body rear along the edge, when the retractable mechanical member is in an inwardly retracted state;
wherein the retractable mechanical member further comprises an electric drive component, and the electric drive component comprises a first rack, a second rack, a sliding support shaft, a gear, a motor gear, and a connecting rod;
the first rack is disposed on an inside of a screen region located at the body front, the second rack is disposed on an inside of a screen region located at the body rear, and the sliding support shaft is disposed on an inside of a screen region located at the edge;
the first rack meshes with a side of the gear facing the body front, the second rack meshes with a side of the gear facing the body rear, and the motor gear meshes with a side of the gear facing the edge;

the motor gear is further drivingly connected to one end of the connecting rod, and the other end of the connecting rod is connected to the sliding support shaft; and the motor gear is configured to drive the second rack to move in a direction parallel to the body rear, and to drive the connecting rod and the sliding support shaft to move in the direction parallel to the body rear.

15. The retractable mechanical member according to claim 14, wherein a moving speed of the second rack is twice a moving speed of the sliding support shaft.

16. The retractable mechanical member according to claim 14, further comprising: a first screen support housing disposed on the inside of the screen region located at the body front; and a second screen support housing disposed on the inside of the screen region located at the body rear; and wherein the first rack is fixed to the first screen support housing and the second rack is fixed to the second screen support housing.

17. The retractable mechanical member according to claim 14, further comprising a flexible backing material and the flexible backing material is disposed between the sliding support shaft and the screen region at the edge.

* * * * *